(12) United States Patent
Roberts et al.

(10) Patent No.: US 12,320,988 B2
(45) Date of Patent: Jun. 3, 2025

(54) BROADBAND POLARIZATION SPLITTING BASED ON VOLUMETRIC META-OPTICS

(71) Applicant: CALIFORNIA INSTITUTE OF TECHNOLOGY, Pasadena, CA (US)

(72) Inventors: Gregory Roberts, Pasadena, CA (US); Andrei Faraon, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 871 days.

(21) Appl. No.: 17/475,167

(22) Filed: Sep. 14, 2021

(65) Prior Publication Data
US 2022/0004016 A1  Jan. 6, 2022

Related U.S. Application Data

(63) Continuation-in-part of application No. 16/657,640, filed on Oct. 18, 2019, now Pat. No. 11,239,276.
(Continued)

(51) Int. Cl.
*G02B 27/28* (2006.01)

(52) U.S. Cl.
CPC ................... *G02B 27/283* (2013.01)

(58) Field of Classification Search
CPC .... G02B 27/28; G02B 27/283; G02B 27/285; G02B 27/286; G02B 5/30; G02B 5/3025; G02B 2207/101; G02B 1/002; G02B 5/18–1871; G02B 5/32; G02B 2005/1804; G02B 26/06; G02B 26/08; G02B 26/0808; G02B 27/10; G02B 27/1073; G02B 27/1086; G02B 27/1093; G02B 27/42;
(Continued)

(56) References Cited

U.S. PATENT DOCUMENTS

| 3,971,065 A | 7/1976 | Bayer |
| 5,385,114 A | 1/1995 | Milstein et al. |

(Continued)

FOREIGN PATENT DOCUMENTS

| CN | 1635662 A | 7/2005 |
| CN | 101044631 A | 9/2007 |

(Continued)

OTHER PUBLICATIONS

Li et al., "UV to NIR optical properties of IP-Dip, IP-L, and IP-S after two-photon polymerization determined by spectroscopic ellipsometry", Optical Materials Express, vol. 9, No. 11, pp. 4318-4328, Nov. 1, 2019 (Year: 2019).*

(Continued)

*Primary Examiner* — Stephone B Allen
*Assistant Examiner* — Adam W Booher
(74) *Attorney, Agent, or Firm* — Steinfl + Bruno LLP

(57) ABSTRACT

Methods and devices to split electromagnetic waves across broad bandwidths in correspondence with predefined polarization state vectors are disclosed. The described methods can be used cameras or image sensors measuring directly the polarization states of an incident electromagnetic waves. The devices include three-dimensional (3D) scattering structures made of dielectric pillars and using existing CMOS processes and direct write lithography techniques. Performance metrics based on the intensity and contrast of the split electromagnetic waves are also disclosed.

13 Claims, 12 Drawing Sheets

Related U.S. Application Data

(60) Provisional application No. 63/078,425, filed on Sep. 15, 2020.

(58) Field of Classification Search
CPC ............ G02B 27/4205; G02B 27/4233; G02B 27/4261; G02B 27/4288
See application file for complete search history.

(56) References Cited

U.S. PATENT DOCUMENTS

| | | |
|---|---|---|
| 5,438,414 A | 8/1995 | Rust |
| 6,991,334 B2 | 1/2006 | Okuyama et al. |
| 7,408,712 B2 | 8/2008 | Ruoff et al. |
| 7,864,114 B2 | 1/2011 | Sanada |
| 7,903,530 B2 | 3/2011 | Kim |
| 7,911,386 B1 | 3/2011 | Itoh et al. |
| 8,002,998 B2 | 8/2011 | Iwata et al. |
| 9,159,761 B2 | 10/2015 | Kokubun |
| 9,170,358 B2 | 10/2015 | Chen |
| 9,207,357 B2 | 12/2015 | Steinhardt et al. |
| 9,254,089 B2 | 2/2016 | Tearney et al. |
| 9,739,918 B2 | 8/2017 | Arbabi et al. |
| 11,239,276 B2 | 2/2022 | Roberts et al. |
| 11,397,331 B2 | 7/2022 | Camayd-Munoz et al. |
| 2002/0057431 A1 | 5/2002 | Fateley et al. |
| 2003/0028114 A1 | 2/2003 | Casscells, III et al. |
| 2003/0082105 A1 | 5/2003 | Fischman et al. |
| 2003/0118799 A1 | 6/2003 | Miller et al. |
| 2003/0210396 A1 | 11/2003 | Hobbs et al. |
| 2004/0184006 A1 | 9/2004 | Okuyama et al. |
| 2005/0234220 A1 | 10/2005 | Koga et al. |
| 2005/0237134 A1 | 10/2005 | Furuya et al. |
| 2006/0057707 A1 | 3/2006 | Cunningham et al. |
| 2006/0113622 A1 | 6/2006 | Adkisson et al. |
| 2007/0019306 A1 | 1/2007 | Wu et al. |
| 2007/0229955 A1 | 10/2007 | Kawamura et al. |
| 2007/0233396 A1 | 10/2007 | Tearney et al. |
| 2008/0013960 A1 | 1/2008 | Tearney et al. |
| 2008/0047928 A1 | 2/2008 | Iwata et al. |
| 2008/0157140 A1 | 7/2008 | Cho |
| 2008/0161194 A1 | 7/2008 | Turner et al. |
| 2009/0052019 A1 | 2/2009 | Brueck et al. |
| 2009/0250110 A1 | 10/2009 | Yu et al. |
| 2010/0033818 A1 | 2/2010 | Petcavich et al. |
| 2010/0107693 A1 | 5/2010 | Rajala et al. |
| 2010/0148283 A1 | 6/2010 | Shih |
| 2010/0149617 A1 | 6/2010 | Kroll et al. |
| 2010/0264295 A1 | 10/2010 | Van Dijk et al. |
| 2010/0302481 A1 | 12/2010 | Baum et al. |
| 2011/0069377 A1 | 3/2011 | Wu et al. |
| 2011/0237892 A1 | 9/2011 | Tearney et al. |
| 2011/0285942 A1 | 11/2011 | Guo et al. |
| 2012/0013989 A1 | 1/2012 | Choi et al. |
| 2012/0082863 A1 | 4/2012 | Ohta et al. |
| 2012/0092770 A1 | 4/2012 | Li et al. |
| 2012/0194912 A1 | 8/2012 | Faraon et al. |
| 2013/0099343 A1 | 4/2013 | Toshikiyo et al. |
| 2013/0141190 A1 | 6/2013 | Kitaoka et al. |
| 2013/0208360 A1 | 8/2013 | Coggio et al. |
| 2014/0085693 A1 | 3/2014 | Mosallaei et al. |
| 2014/0092373 A1 | 4/2014 | Tabirian et al. |
| 2014/0146390 A1 | 5/2014 | Kaempfe et al. |
| 2014/0226190 A1 | 8/2014 | Bridges et al. |
| 2014/0270374 A1 | 9/2014 | Unzueta |
| 2014/0293467 A1 | 10/2014 | Palikaras et al. |
| 2014/0339606 A1 | 11/2014 | Lin et al. |
| 2014/0340732 A1 | 11/2014 | Zhang et al. |
| 2015/0198812 A1 | 7/2015 | Gaylord et al. |
| 2016/0025914 A1 | 1/2016 | Brongersma et al. |
| 2016/0054172 A1 | 2/2016 | Roh et al. |
| 2016/0077261 A1 | 3/2016 | Arbabi et al. |
| 2016/0109381 A1 | 4/2016 | Pavani |
| 2016/0206184 A1 | 7/2016 | Tearney et al. |
| 2017/0069678 A1 | 3/2017 | Cheng et al. |
| 2017/0146856 A1 | 5/2017 | Yokota |
| 2017/0373700 A1 | 12/2017 | Lu et al. |
| 2018/0045953 A1 | 2/2018 | Fan et al. |
| 2019/0173191 A1 | 6/2019 | Kamali et al. |
| 2019/0191144 A1 | 6/2019 | Arbabi et al. |
| 2020/0124866 A1 | 4/2020 | Camayd-Munoz et al. |
| 2021/0118938 A1 | 4/2021 | Roberts et al. |
| 2021/0190593 A1 | 6/2021 | Yao et al. |
| 2021/0286188 A1* | 9/2021 | Rubin .................. G02B 27/283 |
| 2022/0214219 A1 | 7/2022 | Faraon et al. |
| 2023/0122182 A1 | 4/2023 | Camayd-Munoz et al. |
| 2023/0207592 A1 | 6/2023 | Watanabe et al. |

FOREIGN PATENT DOCUMENTS

| | | |
|---|---|---|
| CN | 101720447 A | 6/2010 |
| CN | 101868713 A | 10/2010 |
| CN | 102870018 A | 1/2013 |
| CN | 102981205 A | 3/2013 |
| CN | 103048723 A | 4/2013 |
| CN | 103154777 A | 6/2013 |
| CN | 103364955 A | 10/2013 |
| CN | 103399369 A | 11/2013 |
| CN | 204481029 U | 7/2015 |
| CN | 107076884 A | 8/2017 |
| CN | 107664780 A | 2/2018 |
| CN | 109545812 A | 3/2019 |
| CN | 107076884 B | 3/2020 |
| CN | 111684581 A | 9/2020 |
| CN | 113167938 A | 7/2021 |
| CN | 114556166 A | 5/2022 |
| CN | 116344564 A | 6/2023 |
| EP | 3195048 A1 | 7/2017 |
| EP | 3871020 A2 | 9/2021 |
| EP | 3195048 B1 | 11/2021 |
| JP | 2004219998 A | 8/2004 |
| JP | 2004233910 A | 8/2004 |
| JP | 2005084290 A | 3/2005 |
| JP | 2006049902 A | 2/2006 |
| JP | 2006245926 A | 9/2006 |
| JP | 2008052108 A | 3/2008 |
| JP | 2008185799 A | 8/2008 |
| JP | 2009510391 A | 3/2009 |
| JP | 2009223074 A | 10/2009 |
| JP | 2011527930 A | 11/2011 |
| JP | 2011530403 A | 12/2011 |
| JP | 2012015424 A | 1/2012 |
| JP | 2012027172 A | 2/2012 |
| JP | 2012058437 A | 3/2012 |
| JP | 2012058673 A | 3/2012 |
| JP | 2012078541 A | 4/2012 |
| JP | 2012510637 A | 5/2012 |
| JP | 2012530945 A | 12/2012 |
| JP | 2013505479 A | 2/2013 |
| JP | 2013109349 A | 6/2013 |
| JP | 2014534459 A | 12/2014 |
| JP | 2015087431 A | 5/2015 |
| JP | 2015194637 A | 11/2015 |
| JP | 2017527857 A | 9/2017 |
| JP | 2017538974 A | 12/2017 |
| JP | 2021012376 A | 2/2021 |
| JP | 2021521481 A | 8/2021 |
| JP | 2022503657 A | 1/2022 |
| JP | 7069265 | 5/2022 |
| JP | 2022110029 A | 7/2022 |
| KR | 20080061029 A | 7/2008 |
| KR | 20210064240 A | 6/2021 |
| KR | 20220083736 A | 6/2022 |
| TW | 201140141 A | 11/2011 |
| WO | 2004/059784 A1 | 7/2004 |
| WO | 2007/006440 A2 | 1/2007 |
| WO | 2008/113978 A1 | 9/2008 |
| WO | 2010/017503 A1 | 2/2010 |
| WO | 2012/008551 A1 | 1/2012 |
| WO | 2016/044104 A1 | 3/2016 |
| WO | 2016/086204 A1 | 6/2016 |
| WO | 2019/108945 A1 | 6/2019 |
| WO | 2019/113106 A1 | 6/2019 |

(56) References Cited

FOREIGN PATENT DOCUMENTS

| WO | 2019/203926 A1 | 10/2019 |
|---|---|---|
| WO | 2020/146029 A2 | 7/2020 |
| WO | 2021/076154 A1 | 4/2021 |

OTHER PUBLICATIONS

Final Office Action issued for U.S. Appl. No. 16/777,491, filed Jan. 30, 2022, on behalf of California Institute of Technology. Mail date: Aug. 17, 2022. 18 Pages.
First Office Action + Search Report issued for Chinese Application No. 201980067786.X filed on Apr. 14, 2021, on behalf of California Institute of Technology. Issue Date: Aug. 3, 2022. Chinese Original + English Translation. 22 Pages.
Notification of Reasons for Refusal issued for Japanese Patent Application No. 022-076165 filed on May 30, 2022, on behalf of California Institute of Technology. Dispatch Date: Jul. 5, 2022. JP Original and English Translation. 7 Pages.
Notification of Reasons for Refusal issued for JP Application No. 2022-076165 filed on May 30, 2022, on behalf of California Institute of Technology. Dispatched on Jul. 5, 2022. JP Original and English Translation. 7 Pages.
Second Notification of Reasons for Refusal issued for JP Application No. 2022-076165 filed on May 30, 2022, on behalf of California Institute of Technology. Dispatched on Oct. 18, 2022. JP Original and English Translation.
European Examination Report for European Application No. 19909195.0 filed on May 20, 2021 on behalf of California Institute of Technology. Mail Date: Jun. 5, 2023. 4 Pages.
Nersisyan, S. R. "Characterization of optically imprinted polarization gratings," *Appl. Opt.* 48, 4062-4067 (2009).
Notification of Reasons for Refusal issued for JP Application No. 2022-076165 filed on May 30, 2022, on behalf of California Institute of Technology. Dispatched on Feb. 21, 2023. JP Original and English Translation. 7 Pages.
Second Chinese Office Action for Chinese Application No. 201580049474.8 filed on Mar. 14, 2017 on behalf of California Institute of Technology. Mail Date: Feb. 27, 2023. 8 Pages. English + Chinese.
Notice of Reasons for Refusal issued for Japanese Patent Applicaiton No. 2022-515969 filed on Oct. 18, 2019 on behalf of California Institute of Technology. Dispatch Date: Aug. 8, 2023. 15 pages.
Notice To File A Response issued for KR Application No. 10-2021-7009690 filed on Apr. 1, 2021, on behalf of California Institute of Technology. Dispatch Date: Jul. 26, 2023. 5 Pages.
U.S. Appl. No. 16/657,640, filed Oct. 18, 2019, US 20210118938A1 Apr. 22, 2021, U.S. Pat. No. 11,239,276 Feb. 1, 2022, California Institute of Technology, Gregory Roberts et al.
First Office Action issued for Chinese Patent Application No. 201980101356.5 filed on Oct. 18, 2019 on behalf of California Institute of Technology. Issue Date: Aug. 22, 2023. 10 pages. (English translation only).
Non-Final Office Action issued for U.S. Appl. No. 17/853,540, filed Jun. 29, 2022 on behalf of California Institute of Technology. Mail Date: Nov. 16, 2023. 30 pages.
Notice of Reasons for Refusal issued for Japanese Patent Application No. 2021-512844 filed on Mar. 8, 2021 on behalf of California Institute of Technology. Dispatch Date: Sep. 5, 2023. 13 pages. (English translation only).
Restriction Requirement issued for U.S. Appl. No. 17/853,540, filed Jun. 29, 2022 on behalf of California Institute of Technology. Mail Date: Sep. 22, 2023. 6 Pages.
Third Chinese Office Action issued for CN application No. 201980067786.X filed on Apr. 14, 2021 on behalf of California Institute of Technology. Issue Date: Sep. 14, 2023. 5 pages. English translation only.
Final Office Action issued for U.S. Appl. No. 17/853,540, filed Jun. 29, 2022 on behalf of California Institute of Technology. Mail Date: Mar. 21, 2024. 16 pages.

1.98(d) statement + List. Jun. 24, 2024. 1 page.
Rejection Decision issued for CN Application No. 201980067786.X filed on Apr. 14, 2021 on behalf of California Institute of Technology. Mail Date: Jan. 2, 2024. Chinese + English translation. 9 pages.
Second Notice of Reasons for Refusal issued for Japanese Patent Application No. 2022-515969 filed on Oct. 18, 2019 on behalf of California Institute of Technology. Dispatch Date: Jan. 9, 2024. 6 pages. (English translation + Japanese Original).
Second Notice of Reasons for Refusal issued for Japanese Patent Application No. 2021-512844 filed on Mar. 8, 2021 on behalf of California Institute of Technology. Dispatch Date: Jan. 30, 2024. 14 pages. (English translation + Japanese Original).
Certificate of Patent Issued for Japanese Patent Application No. 2020-153339 filed on Sep. 11, 2020, on behalf ofCalifornia Institute of Technology. Issued May 9, 2022. 3 Pages.
Decision to Grant Issued for Japanese Patent Application No. 2020-153339 filed on Sep. 11, 2020, on behalf of California Institute of Technology. Draft Date: Mar. 30, 2022. JP Original and ENG Translation.
Extended European Search Reportissued for EP Application No. 19909195.0 filed on May 20, 2021, on behalfof California Institute of Technology. Mail Date: May 30, 2022. 10 Pages.
International Preliminary Report on Patentability for International Application No. PCT/US2019/057026 filed on Oct. 18, 2019, on behalf of California Institute of Technology. Mail Date: Apr. 28, 2022. 8 Pages.
Nishiwaki, S., et al., "Efficient colour splitters for high-pixel-density image sensors", *Nature Photonics*, vol. 7, No. 3, Feb. 3, 2013. pp. 248-254. 7 Pages. XP055358688, London ISSN: 1749-4885, DOI: 10.1038/nphoton.2012.345.
Non-Final Office Action issued for U.S. Appl. No. 16/777,491, filed Jan. 30, 2022, on behalfof California Institute of Technology. Mail Date: May 4, 2022. 37 Pages.
Notice of Allowability for U.S. Appl. No. 16/656,156, filed Oct. 17, 2019, on behalf of California Institute of Technology. Mail Date: Jun. 8, 2022. 3 Pages.
Notice of Allowance for U.S. Appl. No. 16/656,156, filed Oct. 17, 2019, on behalf of California Institute of Technology. Mail Date: Apr. 7, 2022. 11 Pages.
Notification of Reasons for Refusal Issued for Japanese Patent Application No. 2020-153339 filed on Sep. 11, 2020, on behalf of California Institute of Technology. Mail Date: Nov. 30, 2021. Japanese Original + English Translation. 5 Pages.
Search Reportissued for Japanese Patent Application No. 2020-153339 filed on Sep. 11, 2020, on behalf of California Institute of Technology. Date Available: Oct. 27, 2021. Japanese Original English Translation. 24 Pages.
Afifi S., et al., "Electromagnetic Scattering From 3D Layered Structures With Randomly Rough Interfaces: Analysis With the Small Perturbation Method and the Small Slope Approximatio,". IEEE Transactions on Antennas and Propagation [online], Jul. 2014 [Retrieved on Jul. 20, 2020]. 9 Pages. Retrieved from https://ieeexplore.ieee.org/abstract/document/6862023.
Aieta, F. et al., "Aberration-free ultrathin flat lenses and axicons attelecom wavelengths based on plasmonic metasurfaces." *Nano Lett.* 12,4932-4936. Aug. 15, 2012. 5 Pages.
Aieta, F. et al., "Multiwavelength achromatic metasurfaces by dispersivephase compensation," *Science* 347, 1342-1345. Mar. 20, 2015. 4Pages.
Allowance for Chinese Application No. 201580049474.8 filed on Mar. 14, 2017 on behalf of California Institute of Technology. Mail Date: Dec. 31, 2019. Chinese + English Trans. 3 Pages.
Andreou, A. G., et al., "Polarization Imaging : Principles and IntegratedPolarimeters," *IEEE Sensors Journal*, vol. 2, No. 6, Dec. 2002.pp. 566-576. 11 Pages.
Appeal Decision of Refusal issued for JP Patent Application No. 2017-513414 filed on Sep. 11, 2015, on behalf of California Institute of Technology. Issue Date: Jul. 13, 2021. Japanese Original and ENG Transl. 42 Pages.
Arbabi, A., et al., "Conference Presentation : Increasing Efficiency of high-NA Metasurface Lenses," Proc. Of SPIE vol. 10113. Apr. 28, 2017. Abstract Only. 1 Page. Watch Online at https://www.spiedigitallibrary.org/conference-proceedings-of-spie/10113/101130K/

(56) References Cited

OTHER PUBLICATIONS

Increasing-efficiency-of-high-NA-metasurface-lenses-Conference-Presentation/10.1117/12.2250391.short.
Arbabi, A. et al., "Controlling the phase front ofoptical fiber beams using high contrast Metastructures," *OSA Technical Digest*, STu3M.4 Optical Society of America, Jan. 2014. 2 Pages.
Arbabi, A., et al., "Dielectric metasurfaces for complete control ofphase and polarization with subwavelength spatial resolution and high transmission," Nature Nanotechnology, published online on Aug. 31, 2015. 8 Pages.
Arbabi, A. et al., "Fundamental limits ofultrathin metasurfaces," Preprintat http://arXiv.org/abs/1411.2537.Nov. 10, 2014. 6 Pages.
Arbabi, A., et al., "Miniature optical planar camera based on awide-angle metasurface doublet corrected for monochromatic aberrations," *NatureCommunications*, 7:13682. Published Nov. 28, 2016. 9 Pages.
Arbabi, A., et al., "Planar Metasurface Retroreflector," *NaturePhotonics*, Advance Online Publication. Published Online Jun. 19, 2017. 7 Pages.
Arbabi, A., et al., "Subwavelength-thick lenses with high numerical apertures and large efficiency based on high-contrast transmitarrays," Nature Communications. 6:7069. May 7, 2015. 9 Pages.
Arbabi, E., et al., "Controlling the signofchromatic dispersion in diffractiveoptics with dielectric metasurfaces," *Optica*, V. 4, N. 6. Jun. 2017. 8 Pages.
Arbabi, E., et al., "Full-Stokes Imaging Polarimetry Using DielectricMetasurfaces," ACS Photonics 2018, 5, 3132-3140. Mar. 21, 2018. 9 Pages.
Arbabi, E., et al., "MEMS-tunable dielectric metasurface lens," NatureCommunications, 9:812. Feb. 23, 2018. 9 Pages.
Arbabi, E., et al., "Multiwavelength metasurfaces through spatial multiplexing," *Scientific Reports*, 6:32803. Sep. 6, 2016. 8 Pages.
Arbabi, E., et al., "Multiwavelength polarization-insensitive lenses basedon dielectric metasurfaces with meta-molecules," Optica, vol. 3, No. 6. Jun. 10, 2016. pp. 628-633. 6 Pages.
Arbabi et al., "Dielectric metasurfaces for complete control ofphase and polarization with subwavelength spatial resolution and high transmission," + Supplementary Information. Nature Nanotechnology doi: 10.1038/nnano.2015.186/. Nov. 2015. 17 Pages.
Astilean, S., et al., "High-efficiency subwavelength diffractive element patterned in a high-refractive-index material for 633 nm," *Optics Letters*, vol. 23, No. 7, Apr. 1, 1998. pp. 552-554. 3 Pages.
Balthasar Mueller, J. P., et al., "Ultracompact metasurface in-linepolarimeter," *Optica*, vol. 3, No. 1. Jan. 2016. pp. 42-47.6 Pages.
Camayd-Muñoz, P., et al., "Multifunctional volumetric meta-optics for colorand polarization image sensors," *Optica*, 7(4), pp. 280-283. Apr. 2020. 4 Pages.
Camayd-Muñoz, P., et al., Supplementary material for "Multifunctional volumetric meta-optics for color and polarization image sensors," Published in Optica, V. 7 No. 4, Mar. 31, 2020. 5 Pages.
Charanya, T., et al., "Trimodal color-fluorescence-polarization endoscopy aided by a tumor selective molecular probe accurately detects flat lesions in colitis-associated cancer," J. Biomed. Opt. 19(12) 126002, Dec. 2014, 15 pages.
Chen, W. T., et al, "Integrated Plasmonic Metasurfaces for Spectropolarimetry," Nanotechnology 27, 224002. Apr. 26, 2016. 8 Pages.
Chihhui, Wu., et al., "Spectrally selective chiral silicon metasurfaces based on infrared Fano resonances", Nature Communications, vol. 5, May 27, 2014, XP055465835, DOI: 10.1038/ncomms4892. 9 Pages.
Coffeen, D.L., et al., "Polarization and scattering characteristics in the atmospheres of Earth, Venus, and Jupiter," J. Opt. Soc. Am., vol. 69, No. 8, Aug. 1979. pp. 1051-1064. 14 Pages.
Communication under Rule 71(3) issued for EPPatent application 15842895.3 filed on Mar. 8, 2017, on behalf ofCalifornia Institute of Technology. Mail Date: May 25, 2021. 5 Pages.
Corrected Notice of Allowance for U.S. Appl. No. 16/657,640, filed Oct. 18, 2019, on behalfof California Institute of Technology. Mail Date: Dec. 9, 2021. 11 Pages.

Decision of Refusal for JP Patent Application No. 2017-513414 filed on Sep. 11, 2015, on behalf of California Institute of Technology. Dispatch Date: May 12, 2020. Japanese + English Trans. 19 Pages.
Decision to Grant for EP Patent application 15842895.3 filed on Mar. 8, 2017, on behalf of California Institute of Technology. Mail Date: Oct. 7, 2021. 1 Page.
Decker, M., et al., "High-efficiency dielectric Huygens' surfaces," Adv.Opt. Mater. 3, 813-820. Feb. 1, 2015. 8 Pages.
Deguzman, P. C., et al., "Stacked subwavelength gratings as circular polarization filters," *Applied Optics*, vol. 40, No. 31. Nov. 1, 2001. pp. 5731-5737. 7 Pages.
Ding, F., et al. "Beam-Size-Invariant Spectropolarimeters UsingGap-Plasmon Metasurfaces," ACS Photonics, 943-49. Published Feb. 28, 2017. 7 pages.
Dottermusch, S., et al., "Exposure-dependent refractive index of Nanoscribe IP-Dip photoresist layers," *Optics letters*, 44, V. 1, Jan. 1, 2019. pp. 29-32. 4 Pages.
Egan, W. G., "Terrestrial polarization imagery obtained from the SpaceShuttle: characterization and interpretation," *Applied Optics*, vol. 30, No. 4. Feb. 1, 1991. pp. 435-441. 8 pages.
Ellenbogen, T., et al., "Chromatic Plasmonic Polarizers for Active VisibleColor Filtering and Polarimetry," *ACS Publications*, Nano Lett. 2012, 12. Jan. 9, 2012, 1026-1031. 6 Pages.
Evlyukhin, A. B., et al., "Multipole light scattering by nonsphericalnano particles in the discrete dipole approximation," Phys. Rev. B 84,235429. Dec. 20, 2011. 8 pages.
Fattal, D., et al., "Flat dielectric grating reflectors with focusing-abilities," Nature Phonics, vol. 4. Jul. 2010. pp. 466-470. 5Pages.
Final Office Action for U.S. Appl. No. 16/656,156, filed Oct. 17, 2019, on behalf of California Institute of Technology. Mail Date: Dec. 1, 2021. 20 Pages.
First Chinese Office Action for Chinese Application No. 201580049474.8 filed on Mar. 14, 2017 on behalf of California Institute of Technology. Mail Date: Dec. 19, 2018. 16 Pages. English + Chinese.
Flanders, D.C., "Submicrometer periodicity gratings as artificial anisotropic dielectrics," *Applied Physics Letters*, 42: p. 492-4. Mar. 15, 1983. 4 Pages.
García-Etxarri, A. et al., "Strong magnetic response of submicronsilicon particles in the Infrared," Opt. Express 19, 4815-4826. Feb. 28, 2011. 12 Pages.
Garcia, M., et al., "Bio-inspired color-polarization imager forreal-time in situ imaging," *Optica*, vol. 4, No. 10. Oct. 2017.pp. 1263-1271. 9 Pages.
Garcia, N. M., "Surface Normal reconstruction using circularly polarized light," *Optics Express*, vol. 23, No. 11. Jun. 1, 2015. pp. 14391-14406. 16 Pages.
Gissibl, T., et al., "Refractive index measurements of photo-resists for three-dimensional direct laser writing," *Optical Materials Express*, 7(7), 2293-2298. Jul. 1, 2017. 6 Pages.
Groever, B., et al., "Meta-lens doublet in the visible region," Nano Lett. 17, 4902-4907, Jun. 29, 2017. 6 Pages.
Gruev, V., et al., "CCD polarization imaging sensor with aluminum nanowire optical filters," *Optics Express*, vol. 18, No. 18. Aug. 2010. pp. 19087-19094. 8 Pages.
Gruev, V., et al., "Fabrication ofa dual-tier thin film micro polarizationarray," *Optics Express*, vol. 15, No. 8. Apr. 16, 2007. pp 4994-5007.14 Pages.
Gruev, V., et al., "Image Sensor With Focal Plane Extraction of Polarimetric Information" *IEEE, ISCAS*. Jan. 2006. pp. 213-216. 4 Pages.
Guo, J., et al., "Fabrication of thin-film micro polarizer arrays for visibleimaging polarimetry," *Applied Optics*, vol. 39, No. 10. Apr. 1, 2000.pp. 1486-1492. 7 Pages.
Hong, L., et al., "Integrated Angle-Insensitive Nanoplasmonic Filters for Ultraminiaturized Fluorescence Microarray in a 65 nm Digital CMOS Process," ACS Photonics, 5, Sep. 12, 2018. pp. 4312-4322. 11 Pages.
Hsiao, H-H., et al., "Fundamentals and Applications of Metasurfaces," *Small Methods*, Mar. 24, 2017. 20 Pages.

(56) References Cited

OTHER PUBLICATIONS

International Search Report and Written Opinion for International Application No. PCT/US2019/057026 filed on Oct. 18, 2019 on behalf of California Institute of Technology Mail Date: Aug. 10, 2020 12 pages.
International Search Report and Written Opinion for PCT App. No. PCT/US2019/056809 filed on Oct. 17, 2019 on behalf of California Institute of Technology. Mail Date: Jul. 31, 2020. 13 Pages.
International Search Report and Written Opinion for PCT/US2015/049837filed Sep. 11, 2015 on behalfof California Institute of Technology.Mail Date: Jan. 11, 2016. 13 pages.
Khorasaninejad, M., et al., "Efficient Polarization Beam Splitter PixelsBased on A Dielectric Metasurface," *Optica*, vol. 2, No. 4. Apr. 15, 2015. 7 Pages.
Khorasaninejad, M., et al., "Metalenses at visible wavelengths: Diffraction-limited focusing and subwavelength resolution imaging," Science, vol. 352 Issue 6290, Jun. 3, 2016. pp. 1190-1194. 6 Pages.
Kikuta, H. et al., "Achromatic quarter-wave plates using the dispersion of form Birefringence," Appl. Opt. 36, 1566-1572. Mar. 1, 1997. 7 Pages.
Kildishev, A. V. et al., "Planar photonics with metasurfaces," *Science*339, 1232009, Mar. 15, 2015. 8 Pages.
Klemm, A. B. et al., "Experimental high numerical aperture focusing with high contrast gratings," *Opt. Lett.* 38, 3410-3413. Aug. 28, 2013.4 Pages.
Komar, A., et al., "Electrically tunable all-dielectric opticalmetasurfaces based on liquid crystals," Appl. Phys. Lett. 110, 071109;doi: 10.1063/1.4976504. Feb. 15, 2017. 5 Pages.
Kozawa, Y. et al., "Generation of a radially polarized laser beam by useof a conical Brewster prism," *Opt. Lett.* 30, 3063. Nov. 15, 2005.3 Pages.
Kuznetsov, A. I., et al., "Optically resonantdielectricnanostructures," Science, V. 354 Issue 6314. Nov. 18, 2016. 10 Pages.
Lalanne, P., "Blazed binary subwavelength gratings with efficiencies larger than those of conventional echelette gratings," *Optics Letters*, vol. 23, No. 14. Jul. 15, 1998. 1081-1083. 3 Pages.
Lalanne, P. et al., "Design and fabrication of blazed binary diffractive elements with 20 sampling periods smaller than the structural cutoff," *J. Opt. Soc. Am.* A 16, 1143-1156. May 1999. 14 Pages.
Lin, D., et al., "Dielectric gradient metasurface optical elements," Science, U.S.A., vo. 345, p. 298-302. Jul. 18, 2014. 6 Pages.
Lin, D., et al., "Photonic Multitasking Interleaved Si Nano antennaPhased Array," *Nano Lett.*, 16. Nov. 18, 2016. pp. 7671-7676. 6Pages.
Lin, J. et al., "Nanostructured holograms for broad band manipulation o fvector beams," *Nano Lett.* 13, 4269-4274. Aug. 5, 2013. 6 Pages.
Liu, V., et al., "S4: a free electromagnetic solver for layered periodic structures," Comput. Phys. Commun. 183, 2233-2244. Available online May 19, 2012. 12 Pages.
Liu, Y., et al., "Complementary fluorescence-polarization microscopy using division-of-focal-plane polarization imaging sensor," Journal of Biomedical Optics, 17 (11). Nov. 2012. 116001-1-116001-4. 5Pages.
Lu, F., et al., "Planar high-numerical-aperture low-loss focusingreflectors and lenses using subwavelength high contrast gratings," OpticsExpress, vol. 18, No. 12. Jun. 7, 2010. pp. 12606-12614. 9 Pages.
Monticone, F., et al., "Full control of nanoscale optical transmissionwith a composite Metascreen," *Phys. Rev. Lett.* 110, 203903. May 17, 2013.5 Pages.
Mutlu, M., et al., "Experimental realization of a high-contrast gratingbased broadband quarter-wave plate," *Optics express*, 20: p. 27966-73. Nov. 30, 2012. 8 Pages.
Non-Final Office Action for U.S. Appl. No. 14/852,450, filed Sep. 11, 2015 on behalf of California Institute of Technology. Mail Date: Dec. 12, 2016. 11 Pages.

Non-Final Office Action for U.S. Appl. No. 16/656,156, filed Oct. 17, 2019, on behalf of California Institute of Technology. Mail Date: Jul. 27, 2021. 13 pages.
Nordin, G. P., et al., "Diffractive Optical Elements for Strokes VectorMeasurement with a Focal Plane Array," *Proceedings of SPIE*, vol. 3754.Part ofthe Conference on Polarization. Jul. 1999. 10 Pages.
Nordin, G. P., et al., "Micropolarizer array for infrared imaging polarimetry," *J. Opt. Soc. Am. A.*, vol. 16, No. 5. May 1999. pp. 1168-1174. 7 Pages.
Notice of Allowance for U.S. Appl. No. 16/657,640, filed Oct. 18, 2019, on behalf of California Institute of Technology. Mail Date: Sep. 29, 2021. 9 Pages.
Notice of Allowance for U.S. Appl. No. 14/852,450, filed Sep. 11, 2015 on behalf of California Institute of Technology. Mail Date: Apr. 25, 2017.11 Pages.
Notification for Reason ofRefusal for JP Patent application JP 2017-513414 filed on Sep. 11, 2015 on behalf of California Institute of Technology. Drafting Date: Aug. 15, 2019. Japanese + English Trans. 17 Pages.
Paniagua-Dominguez, R., et al., "A Metalens With Near-Unity Numerical Aperture," *Nano Letters*, Published online on Feb. 27, 2018. 32 Pages.
Pezzaniti, J. L., et al., "Mueller matrix imaging polarimetry," *OpticalEngineering*, vol. 34 No. 6. Jun. 1995. pp. 1558-1568. 11 Pages.
Pfeiffer, C et al., "Cascaded metasurfaces for complete phase andpolarization control," *Appl. Phys. Lett.* 102, 231116. Published online Jun. 11, 2013. 5 pages.
Phelan, C. F. et al., "Generation of a radially polarized light beamusing internal conical diffraction," *Opt. Express* 19, 21793-21802, Oct. 20, 2011. 10 Pages.
Piggot, A.Y., et al.,"Inverse design and demonstration of a compact and broadband on-chip wavelength demimultiplexer" Nat. Photonics 9, Jun. 2015. pp. 374-377. 5 Pages.
Q. Chen et al., "Nanophotonic Image Sensors" Small 12, 4922-4935 (2016). 14 pages.
Restriction Requirement for U.S. Appl. No. 16/656,156, filed Oct. 17, 2019 on behalf of California Institute of Technology Mail Date: Mar. 2, 2021 6 pages.
Roberts, N. W., et al., "Animal Polarization Imaging and Implications for optical Processing," Proceedings of the IEEE, vol. 102 No. 10. Oct. 2014. pp. 1427-1434. 8 Pages.
Rubin, N. A., et al., "Matrix Fourier optics enables a compact full-Stokes polarization camera," *Science*, 365(6448), eaax1839. Jul. 5, 2019. 10 Pages.
Schonbrun, E. et al., "Reconfigurable imaging systems using elliptical nanowires," Nano Lett. 11, 4299-4303. Sep. 16, 2011. 5 Pages.
Second Chinese Office Action for Chinese Application No. 201580049474.8 filed on Mar. 14, 2017 on behalf of California Institute of Technology. MailDate: Aug. 2, 2019. Chinese + English Trans. 11 Pages.
Sell, D., et al., "Large-Angle, Multifunctional Metagratings Based on Freeform Multimode Geometries," Nano Letters. 17, 3752-3757. May 1, 2017. 6 Pages.
Solomon, J. E., et al., "Polarization imaging," *Applied Optics*, vol. 20, No. 9. May 1, 1981. pp. 1537-1544. 8 Pages.
Spinelli, P., et al., "Broadband omnidirectional antireflection coating based on subwavelength surface Mie resonators," Nature Commun. 3,692. Feb. 21, 2012. 5 Pages.
Staude, I., et al., "Metamaterial-inspired silicon nanophotonics," *NaturePhotonics*, vol. 11. May 2017. pp. 274-284. pp. 11 Pages.
Supplementary Search Report and Opinion for EPPatent application 15842895.3 filed on Mar. 8, 2017, on behalf of California Institute of Technology. Mail Date: May 15, 2018. 6 pages.
Swanson, G. J., "Binary optics technology: the theory and design ofmulti-level diffractive optical elements," Technical Report 845. Massachusetts Institute of Technology, DTIC, Aug. 14, 1989. 53 Pages.
Tyo, J.S., et al., "Review of passive imaging polarimetry for remote sensing applications," Applied Optics, vol. 45, No. 22. Aug. 1, 2006.pp. 5453-5469. 17 Pages.

(56) References Cited

OTHER PUBLICATIONS

Vo, S., et al., "Sub-Wavelength Grating Lenses with a Twist," *IEEE Photonics Technology Letters*, vol. 26, No. 13. Jul. 1, 2014. 4 Pages.
Walraven, R., "Polarization imagery," *Optical Engineering*, vol. 20 No. 1. Jan.-Feb. 1981. 5 Pages.
Warren, M.E., et al., "High-efficiency subwavelength diffractive opticalelement in GaAsfor 975 nm," Optics Letters, Jun. 15, 1995. 20: p. 1441-3. 3 Pages.
Wen, D., et al., "Metasurface for characterization of the polarization state oflight," *Optics Express*, vol. 23, No. 8., pp. 10273-10281. Apr. 13, 2015. 10 Pages.
West, P.R. et al., "All-dielectric subwavelength metasurface focusinglens," *Opt. Express* 22, 26212. Oct. 20, 2014. 10 Pages.
Yang, Y. et al., "Dielectric meta-reflectarray for broadband linear polarization conversion and Optical vortex Generation," Nano Lett. 14, 1394-1399. Feb. 18, 2014. 6 Pages.
Yu, N., et al., "A broa band, background-free quarter-wave plate basedon plasmonic Metasurfaces," *Nano letters*, 12: p. 6328-33. Nov. 6, 2012,6 Pages.
Yu, N. et al., "Flat optics with designer metasurfaces," Nature Mater. 13, 139-150. Published online Jan. 23, 2014. 12 Pages.
Yu, N. et al., "Light propagation with phase discontinuities: generalizedlaws of reflection and refraction," *Science* 334, 333-337. Oct. 21, 2011.6 Pages.
Zhan., A., et al., "Metasurface Freeform Nanophotonics," Scientific Reports, 7:1673. Published online on May 10, 2017. 9 Pages.
Zhan, Q., "Cylindrical vector beams from mathematical concepts toapplications," Adv. Opt. Photon. 1, 1-57. Jan. 29, 2009. 57 Pages.
Zhao, Y. et al., "Twisted optical metamaterials for plan arized ultrathin broadband circular polarizers," *Nature Commun*. 3, 870. May 29, 2012.7 Pages.

\* cited by examiner

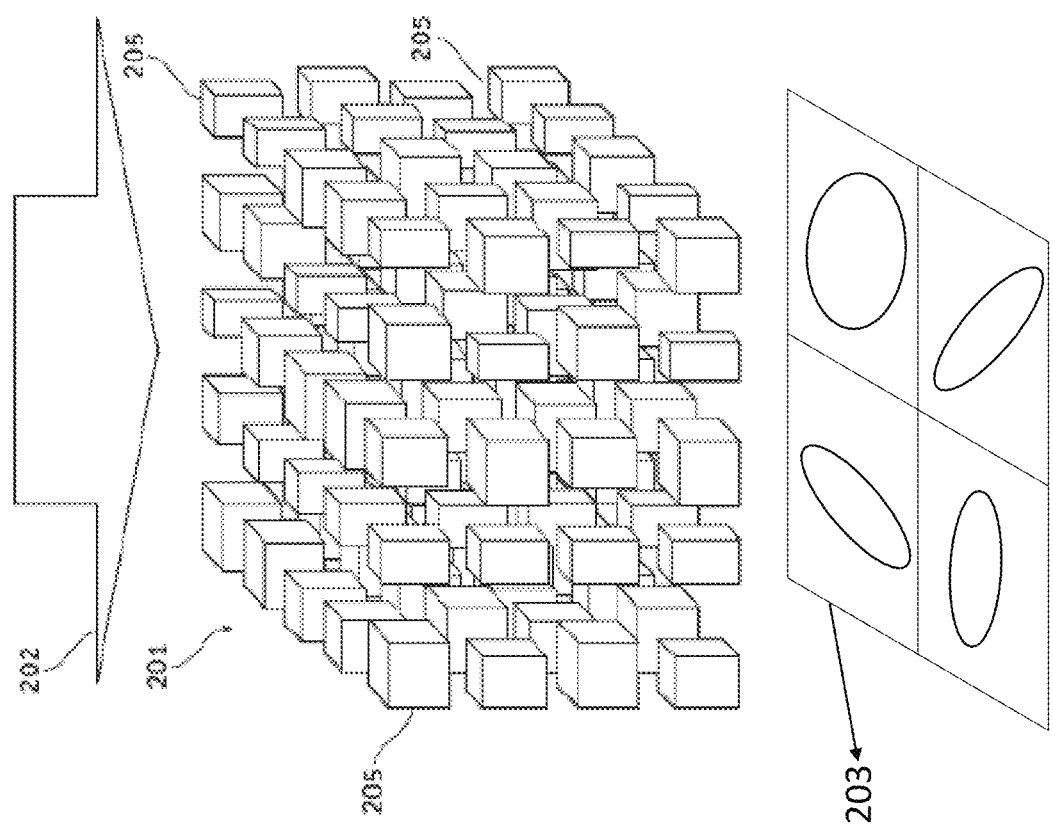

BROADBAND POLARIZATION SPLITTING BASED ON VOLUMETRIC META-OPTICS

CROSS REFERENCE TO RELATED APPLICATIONS

The present application is a continuation in part of U.S. patent application Ser. No. 16/657,640 filed on Oct. 18, 2019, titled "CMOS Color Image Sensors with Metamaterial Color Splitting", the contents of which are incorporated herein by reference in their entirety. The present application also claims priority to U.S. Prov. App. No. 63/078,425, filed on Sep. 15, 2020, titled "Polarization Splitter Based on Volumetric Meta-Optics", the contents of which are incorporated herein by reference in their entirety. The present application is related to U.S. patent application Ser. No. 16/777,491 filed on Jan. 30, 2020, titled "Metasurface Mask for Full-Stokes Division of Focal Plane Polarization of Cameras", the contents of which are incorporated herein by reference in its entirety.

STATEMENT OF GOVERNMENT GRANT

This invention was made with government support under Grant No. HR0011-17-2-0035 awarded by DARPA. The government has certain rights in the invention.

FIELD

The presented disclosure is related to image sensors, and more particularly to broadband polarization splitters manufactured using CMOS fabrication technology.

BACKGROUND

Throughout this document the term "broadband" is referred to wavelength ranges for which the fractional bandwidth is greater or equal to 0.1. The term "fractional bandwidth" is defined as: (highest wavelength−lowest wavelength)/(0.5*(highest wavelength+lowest wavelength)). As an example, the bandwidth of 3.5 to 4 um is considered as broadband because fractional bandwidth is calculated as (4−3.5)/(0.5*(4+3.5))=0.133 which is greater than 0.1

Optical systems are typically designed via modular combinations of elements to achieve complex functions. For example, lenses and diffractive optics can be combined to perform hyperspectral imaging. This approach is intuitive and flexible, providing access to a wide range of functions from a limited set of elements. However, the overall size and weight of the optical system may limit its scope of applications. Recent advancements in nanofabrication may alleviate this constraint by replacing bulky elements with metasurfaces-planar arrays of resonant nanostructures with sub-wavelength thickness. By engineering the scattering of individual elements within the array, these devices can reproduce the multi-functionality of complex optical systems in a single element. However, efforts to combine multiple metasurfaces for more complex functionality have been stymied by reduced scattering efficiency, which scales inversely with the number of simultaneous tasks.

The inherent trade-off between multi-functionality and efficiency in these systems is due to the finite number of degrees of freedom, which scales with the volume of the device and the maximum refractive index contrast. In particular, this limits the range of independent functions achievable by any ultrathin system, such as sorting light according to frequency, polarization, and incident angle. By contrast, three-dimensional scattering elements with thicknesses greater than a wavelength commonly encode many simultaneous functions, albeit so far only with low efficiency due to weak scattering and low index-contrast.

Historically, optical design has been modular, a paradigm that provides an intuitive way to build and reconfigure optical setups. With the advancement of nanofabrication technologies, it became possible to make structures with sub-wavelength feature size that enabled multi-functional optical elements combining the functionality of more complex setups. Examples include metasurface lenses that can split different polarizations and spectral bands. However, the degree of performance and functionality that can be achieved with metasurfaces and other planar structures is inherently limited by the number of optical modes that can be controlled.

Structuring the refractive index with high contrast at sub-wavelength scale provides an expansive optical design space that can be harnessed for demonstrating multi-functional optical elements. So far this has been used mostly in two dimensional structures, or metasurfaces. However, their performance is limited by the available optical degrees of freedom.

Sensing the polarization state of light allows for imaging beyond standard spatial and spectral techniques. For example, because of the way light polarizes on reflection from a surface, orientation of surfaces can be understood by looking at various polarization components of received light on a camera sensor. Polarimetry is conventionally done with bulky optical components. FIG. 1A shows a prior art setup used to measure the full Stokes vector. A waveplate (half or quarter), followed by a Wollaston prism and a lens that focuses the beams on photodetectors. Using no waveplate, a half-waveplate (HWP), and a quarter-waveplate (QWP) along with the prism, one can measure the four Stokes parameters used to fully characterize the polarization state of light.

Through some previous work, it has been shown that polarization sensing can be achievable with metasurfaces but not demonstrated over large bandwidths. Such previous work relied upon six measurements [reference 1].

Practically, a sensing element being able to measure the full polarization state of light over a broad band is highly desired. Moreover, the integration of such sensing element with modern day camera technology is also a very desirable feature.

In order to categorize the polarization state of light including accounting for the not fully polarized state, four measurements of the input light must be made. Each of these measurements needs to compute the projection of the input polarization vector onto one of four known polarization state vectors. By maximally spacing these known polarization state vectors on the Poincare sphere, these four measurements can be used to reconstruct the polarization state of the incoming light. This technique is already known and was demonstrated with an optical element that splits these polarization states [reference 2]. However, in order to make this technique more practical, it would be very useful to split the polarization states onto the four vectors directly on the image sensor. If the splitters are designed on the pixel level, cameras having custom functionalities that vary spatially can be made. Some areas on the sensor can be measuring polarization and some can be measuring spectral information for example. Moreover, one can choose which type of splitter to place above each set of pixels on the camera sensor.

SUMMARY

The disclosed methods and devices address the problems as described above.

Complex three-dimensional (3D) scattering structures allowing the splitting of polarization with higher efficiency are disclosed in the present application.

The disclosed scattering structures can be integrated into modern-day camera sensors. Polarization splitting pixels that are analogous to a typical Bayer filter pixel in a modern-day CMOS camera array [reference 3] are also described. The disclosed devices are designed to split over a broad band based on polarization state instead of sort different colors to different sensors. As a result, such devices can turn an RGB camera into a polarization camera. The disclosed teachings can be adapted for different wavelengths, such as mid infrared.

Cost-effective and large-scale fabrication of such structures poses significant challenges on the design process. The objective is to achieve the best performance given the inherent constraints associated with high-volume CMOS fabrication processes.

The disclosed methods and devices also address the described challenges and provide practical solutions to the above-mentioned problem.

In particular, the disclosed methods and devices teach various steps to design 3D scattering structures using a scalable fabrication process. Currently, the most scalable fabrication that can handle dimensions smaller than 100 nm is the CMOS foundry fabrication process. In the CMOS process, it is possible to fabricate very complex networks of copper wires stacked on top of each other and embedded in $SiO_2$. FIG. 1B shows an example of such networks [reference 6], wherein light and dark gray represent metal and $SiO_2$ respectively. However, according to an embodiment of the present disclosure, the wires can be etched away using liquid etchants so that the final 3D scattering structure is composed of voids in $SiO_2$. In accordance with another embodiment of the present disclosure, the 3D scattering structure can be left as voids in $SiO_2$, or the voids can be filled with higher refractive index materials like $TiO_2$ using atomic layer deposition processes.

Exemplary structures designed this for the mid-infrared as a target for fabrication with direct write lithography [references 4, 5] are presented. As will be described in more detail, the described structure is split into ten distinct layers to show it is amenable to a layered fabrication technique. A scaled version of such design can be used to create a visible light polarization camera sensor when combined with a regular CMOS imaging array.

One of the benefits of a more broadband approach as disclosed is that it allows a camera to receive more signal without needing monochromatic light illuminating a scene. Otherwise, light would need to be filtered around the band where the device operates (e.g., either with an actual filter or using a detector with a narrow absorption response). The broader the device can work with the same polarization states, the more signal can be received into the camera while still reconstructing the polarization state (assuming the polarization states being sensed in a scene are constant across that bandwidth).

According to a first aspect of the present disclosure, an image sensor comprising a three dimensional (3D) scattering structure and a focal plane having four sub-pixels is provided, wherein: the 3D scattering structure comprises a plurality of dielectric pillars, and across a broad bandwidth with a fractional bandwidth of at least 0.1, the plurality of dielectric pillars are configured to split an incident electromagnetic wave along four polarization state vectors and to focus the split incident electromagnetic wave onto the four sub-pixels corresponding to the four polarization state vectors.

According to a second aspect of the present disclosure, a method of splitting an electromagnetic wave, across a broad bandwidth with a fractional bandwidth of at least 0.1 um into four waves with different polarization states is disclosed, the method comprising: applying the electromagnetic wave to a three-dimensional (3D) scattering structure at a first side thereof, the 3D scattering structure being formed into a set 3D pattern in correspondence with four polarization states; and scattering off the electromagnetic wave to generate four electromagnetic waves with four different polarization states, the plurality of electromagnetic waves exiting the 3D scattering structure at a second side thereof.

Further aspects of the disclosure are provided in the description, drawings and claims of the present application.

DESCRIPTION OF THE DRAWINGS

FIGS. 2A-2B show exemplary image sensors according to an embodiment of the present disclosure.

DETAILED DESCRIPTION

Figure 1A:
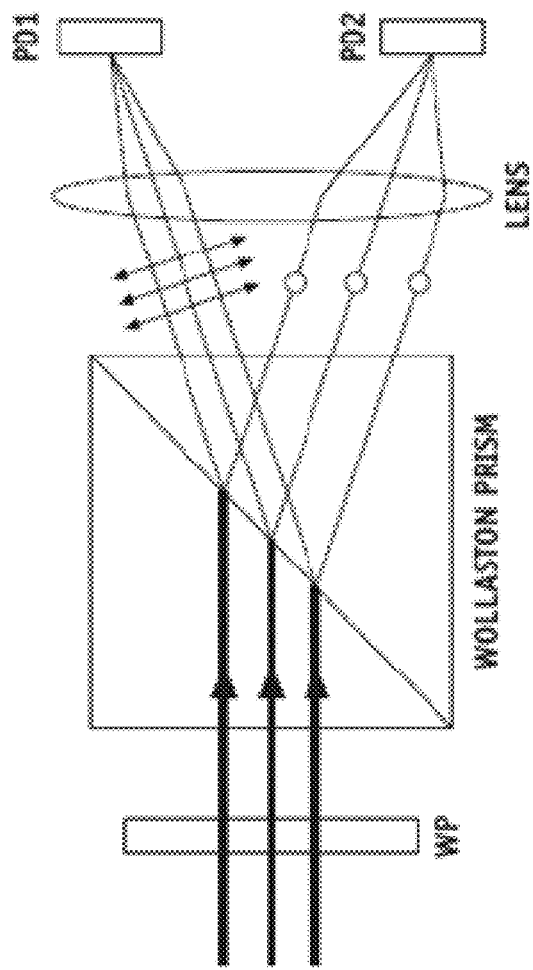
FIG. 1A shows a prior art setup used to measure the full Stokes vector.
Figure 1B:
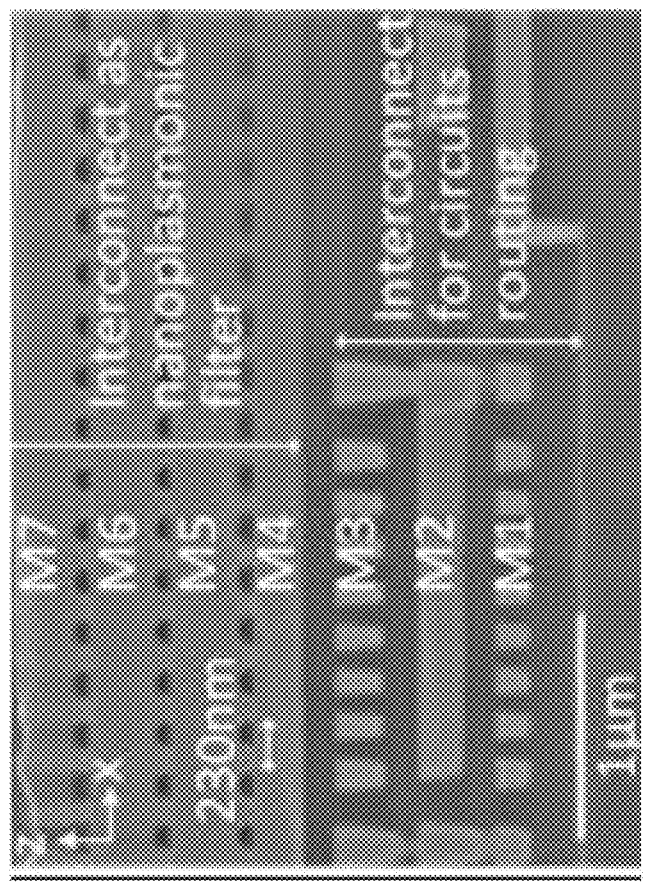
FIG. 1B shows a structure of wires that can be realized using CMOS foundry fabrication techniques, with feature sizes below 100 nm.
Figure 2A:
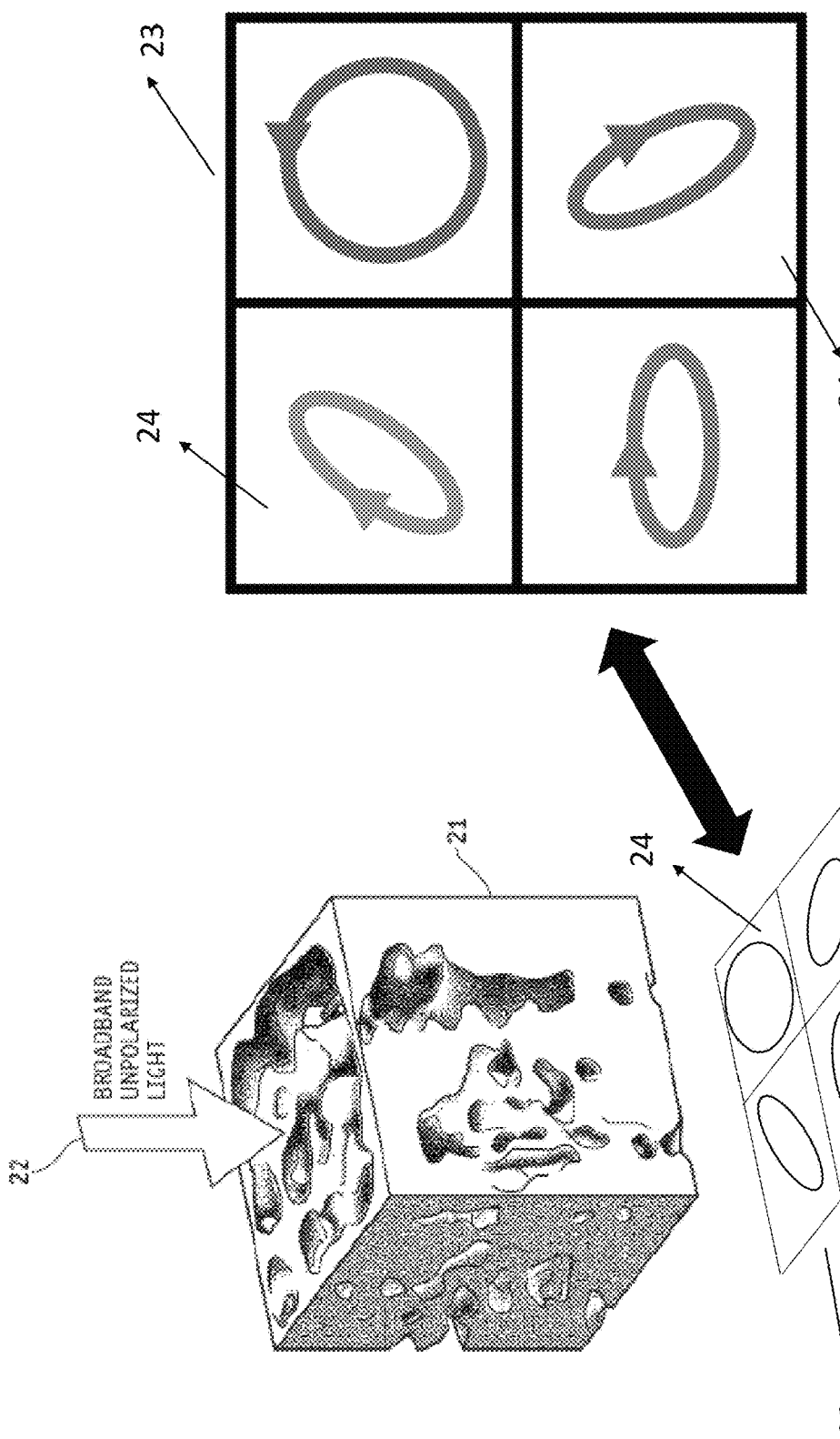

FIG. 2A shows an image sensor (200A) comprising an exemplary three-dimensional (3D) scattering structure (21) functioning as a broadband polarization splitter, according to an embodiment of the present disclosure. Incident light (22) entering from the above is scattered while passing through the 3D scattering structure (21) and sorted in a focal plane (23) consisting of four sub-pixels (24) each sub-pixel (24) receiving a portion of the scattered light having a corresponding polarization state (e.g., circular, elliptical, linear, etc.). In other words, the input polarization state is directly projected onto four different polarization state vectors. Each of the four sub-pixels (24) corresponds to one of the four polarization state vectors. As a result, the polarization across each of the four polarization state vectors is directly sensed/measured and based on such measurements, the polarization state of the incident light (22) can be reconstructed. According to an embodiment of the present disclosure, the four polarization state vectors correspond to maximally spaced polarization states on the Poincare sphere. In other embodiments polarization state vectors different from the four corresponding to maximally polarization states on the Poincare sphere may also be envisaged. In some embodiments, the polarization state vectors comprise Stokes parameters corresponding to circular or elliptical polarizations.

FIG. 2B shows an image sensor (200B) according to an embodiment of the present disclosure. The image sensor (200B) comprises a three-dimensional (3D) scattering structure (201) functioning as a broadband polarization splitter. The 3D scattering structure (201) represents an exemplary implementation of the 3D scattering structure (21) of FIG. 2A and comprises a plurality of dielectric pillars (205) formed to scatter light in a predefined pattern. Incident light (202) passing through the 3D scattering structure (201) is scattered off the dielectric pillars. Through arrangements of the dielectric pillars (205) in accordance with one or more target functions, the scattering pattern can be tailored to perform a desired function. As an example, the 3D scattering structure (201) may be designed as a broadband polarization splitter to simultaneously sort and focus the incident light (202) into four polarization state vectors each directed to an individual sub-pixel on a focal plane (203) placed underneath the 3D scattering structure (201), as shown in FIG. 2A. In accordance with embodiments of the present disclosure, the 3D scattering structure (201) may be a porous polymer cube or a cluster of dielectric or semiconductor (Si for example) particles embedded in a $SiO_2$ matrix. According to further embodiments of the present disclosure, the 3D scattering structure (201) may be a porous polymer cube or a cluster of high-refractive index particles embedded in a low-refractive-index matrix.

With reference to FIGS. 2A-2B, as described more in detail throughout the disclosure, the disclosed devices and methods provide the following additional benefits over existing solutions:

- The 3D scattering structures (200A, 200B) of FIGS. 2A-2B may be manufactured through known and scalable lithographic processes.
- The 3D scattering structure (201) of FIG. 2A may be designed to function as a broadband polarization splitter for arbitrary spectral bands.
- The polarization splitting function may be combined with other desired functions such as spectrum splitting.

With reference to FIGS. 2A-2B, according to the teachings of the present disclosure, the image sensors (200A, 200B) can be used as part of a camera or any similar device using image sensors. The dimensions, orientations, and arrangement (i.e., the pitch and relative spacing) of the dielectric pillars (205) may be selected in correspondence with the polarization state vectors.

The functionality of the exemplary embodiments of FIGS. 2A-2B were described using an incident light however, the teachings of the present disclosure are equally applicable to any electromagnetic wave across a broad bandwidth.

In accordance with embodiments of the present disclosure, the 3D scattering structure (201) of FIG. 2B may be designed using an adjoint variable method, which generates a structure that optimizes a specified objective function. As an example, and referring to FIG. 2B, the objective function may be selected based on the focusing efficiency of incident light into one of four target areas depending on the polarization states. Starting with an empty volume, full-wave finite-difference time-domain (FDTD) simulations are implemented to calculate the sensitivity of this figure of merit to perturbations of the refractive index. The prescribed scattering structure is formed and updated iteratively. In other words, the optimal design is generated through iterative updates to an initial geometry, each step improving the performance. The sensitivity for multiple incident polarization states across the desired broad bandwidth may be calculated, to assign each polarization state to a different quadrant. In an embodiment, a gradient-descent algorithm may be used to iteratively improve and update the initial geometry.

Figure 2C:
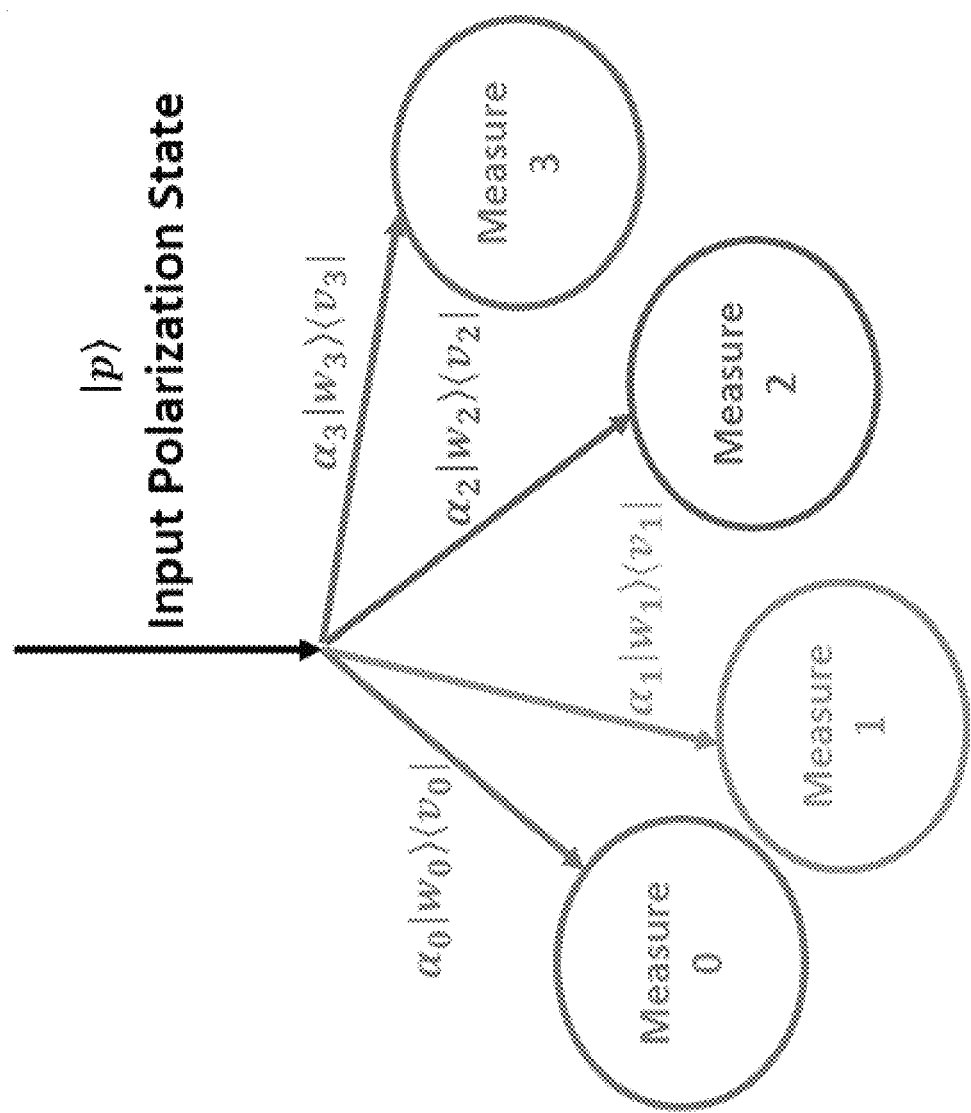
FIG. 2C shows an exemplary diagram illustrating polarization splitting according to an embodiment of the present disclosure.

In order to further clarify the above-disclosed teachings, reference is made to FIG. 2C where diagram (200C) representing the polarization splitting in accordance with an embodiment of the disclosure is shown. The vector components of the input polarization state along four different directions are measured. $|v_i\rangle$, i=0, ... , 3 represent four pure states of polarization, i.e., the four polarization state vectors along which the input polarization is projected. $|w_i\rangle$, i=0, ... , 3 represent four output state of polarizations. $\alpha_i$, i=0, ... , 3 are complex coefficients for mapping of polarization to magnitude. The measurements along each direction are based on intensities and are represented by terms $\hat{Q}_i = \alpha_i |w_i\rangle\langle v_i|$, i=0, ... , 3, such terms essentially representing intensity from measurement with specific phase difference.

With further reference to FIGS. 2A-2C, in order to measure the performance, two metrics may be considered in accordance with the teachings of the present disclosure. The first is the contrast for each polarization state which measures how much larger the transmission is for that polarization state to the desired sub-pixel versus the transmission of its orthogonal polarization state to the same sub-pixel. This may be normalized by the total transmission of both states meaning the contrast can vary between [−1, 1] and is measured for each sub-pixel. A value of 1 is perfect behavior in this metric. The contrast for each sub-pixel may be defined as follows:

$$\text{contrast} \triangleq \frac{\langle v_i|\hat{Q}_i^T\hat{Q}_i|v_i\rangle - \langle \bar{v}_i|\hat{Q}_i^T\hat{Q}_i|\bar{v}_i\rangle}{\langle v_i|\hat{Q}_i^T\hat{Q}_i|v_i\rangle + \langle \bar{v}_i|\hat{Q}_i^T\hat{Q}_i|\bar{v}_i\rangle}$$

With continued reference to FIGS. 2A-2C, the other metric measures the total transmission of the device by looking at net transmission of each polarization state to its desired quadrant. Since there are necessarily overlaps between each of the four chosen polarization states, a maximum of 50% transmission (or 0.5) as the value of the metric measuring net transmission is expected. 50% transmission for every state means it is working as expected and no light is lost from input to the four output sub-pixels. The net transmission for each sub-pixel may be obtained as follows:

$$I_i = \langle v_i|\hat{Q}_i^T\hat{Q}_i|v_i\rangle, i=0, \ldots, 3$$

Figure 2D:
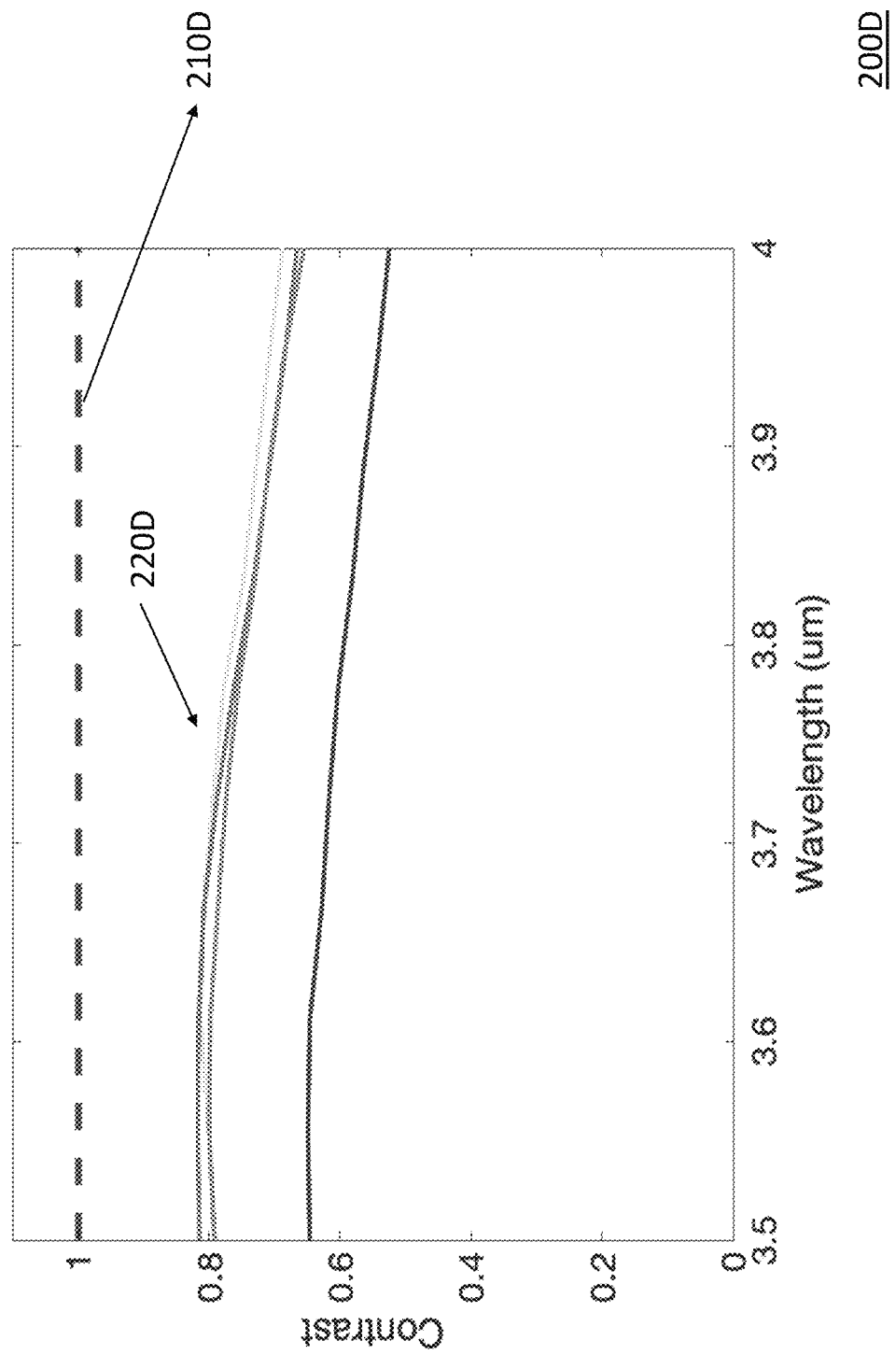
FIGS. 2D-2E show exemplary graphs representing the performance of a 3D scattering structure implemented in accordance with the teachings of the present disclosure.
Figure 2E:
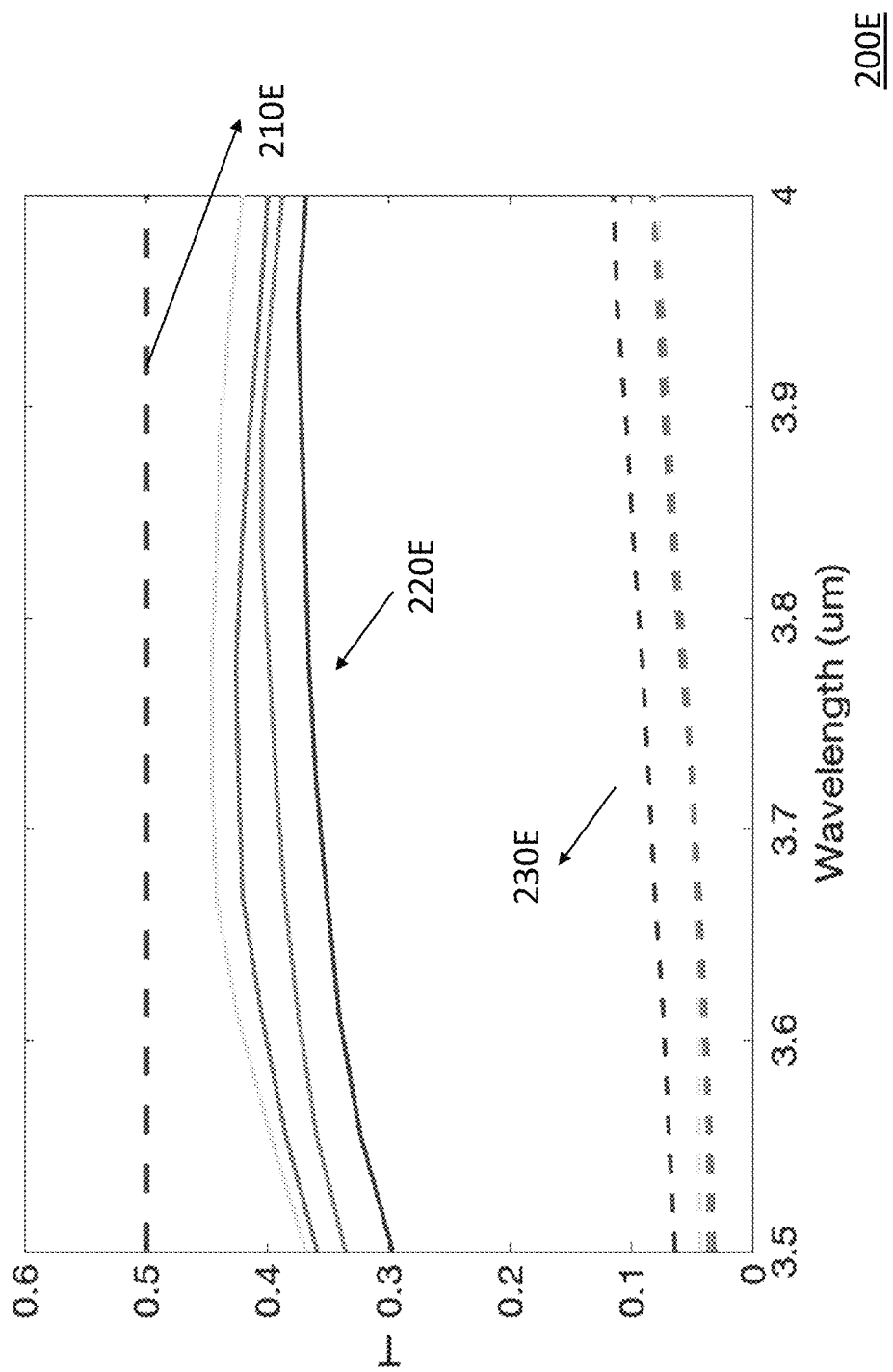

FIGS. 2D-2E show exemplary graphs (200D, 200E) representing the contrast and net transmission across a bandwidth from 3.5-4.0 um, in accordance with the teachings of the present disclosure. The set of four solid lines in each graph represent, i.e., sets of curves (220D, 220E), represents the plots corresponding to the four polarization states received by the focal plane (23) as depicted on in FIG. 2A. The contrast, as shown by graph (200D) of FIG. 2D represents essentially how well the correct polarization is reaching a given sub-pixel of focal plane (23) of FIG. 2A when compared to its orthogonal polarization. The maximum value of 1 is indicated with a dashed line (210D) of FIG. 2D.

With reference to FIG. 2E, the set of curves (220E) represents net transmission for each polarization state to its desired quadrant with the dashed line (210E) at 0.5 indicating the maximum performance. The set of dashed lines (230E) represents the orthogonal polarization state transmission to the same quadrant (these would be 0 in a perfect device with a contrast of 1). The bandwidth of 3.5-4 um as shown is an exemplary bandwidth and embodiments covering other broadband wavelength ranges may also be envisaged according to the teachings of the present disclosure.

With reference to FIGS. 2A-2B, the person skilled in the art will appreciate that the disclosed concept provides substantial flexibility in defining the target scattering function, with independent control for any incident polarization. However, complex three-dimensional structures present a significant challenge for fabrication. Large-scale implementation of these devices in image sensors at visible wavelengths will require high fabrication throughput with sub-100-nm resolution. This may be achieved by multi-layer lithography, where three-dimensional devices are constructed through repeated material deposition and patterning. Here, each layer consists of a series of patterned mesas composed of a high-index dielectric. The interstitial space is filled with a low-index dielectric, forming a flat surface that serves as a substrate for subsequent layers.

Figure 3A:
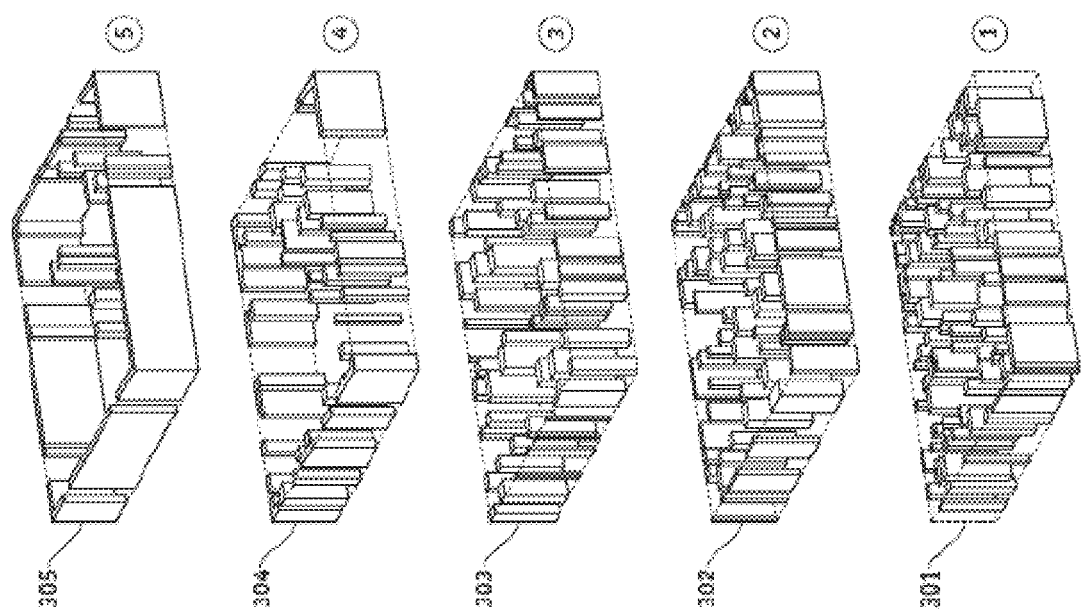
FIGS. 3A-3C show exemplary images sensors and structures according to embodiments of the present disclosure.
Figure 3B:
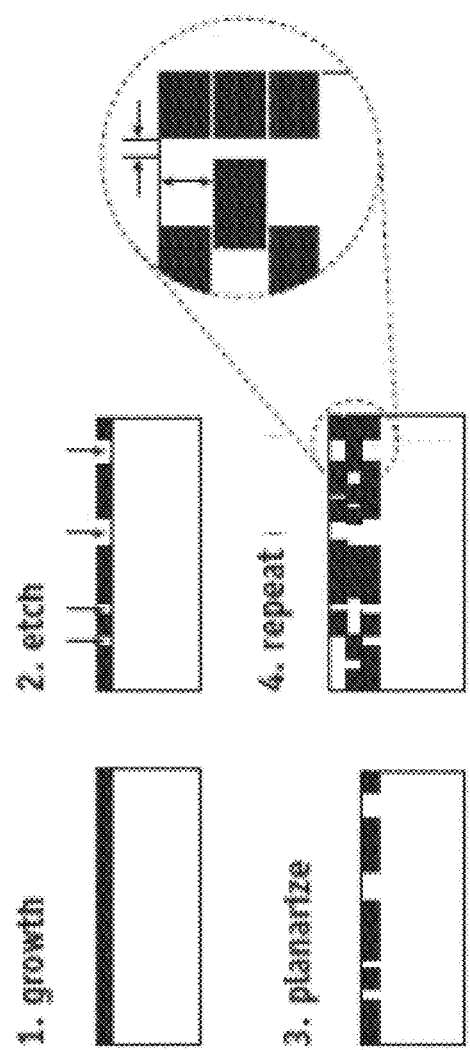
Figure 3B:
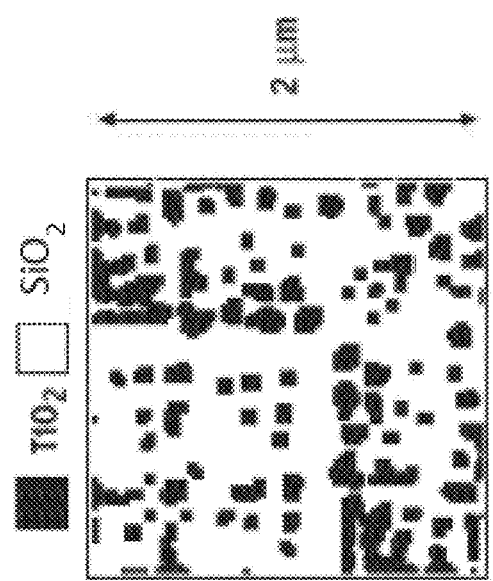
Figure 3C:
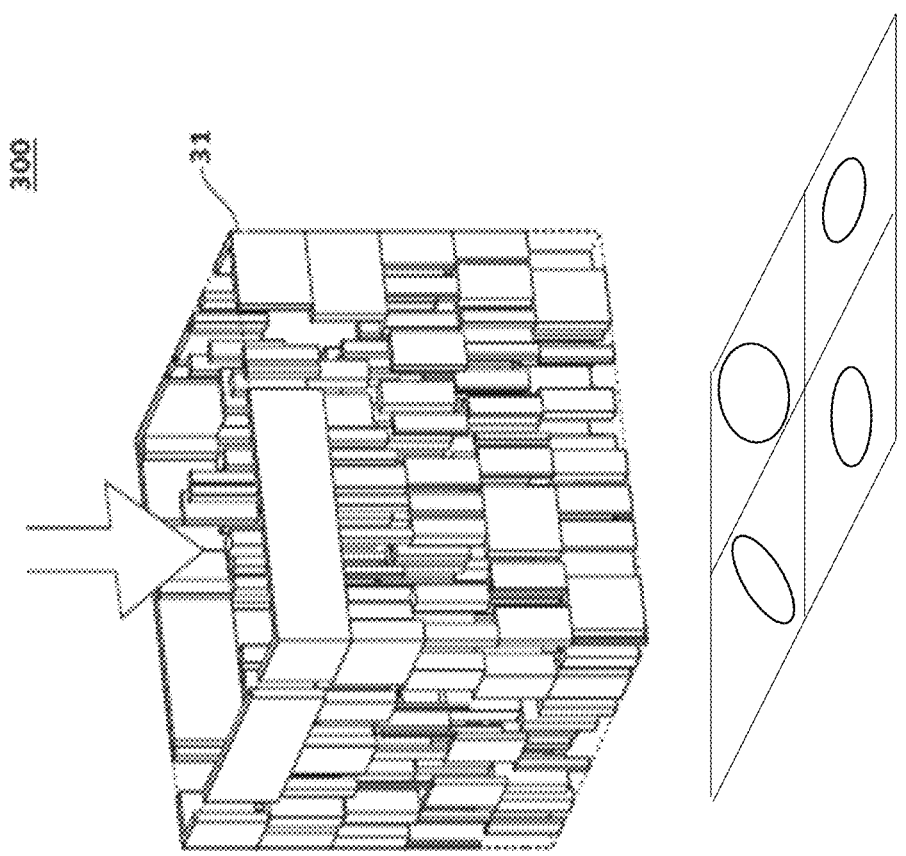

In order to further clarify the layered manufacturing approach discussed above, reference is made to FIGS. 3A and 3C illustrating a layered design of a 3D scattering structure (31) of FIG. 3C. In other words, the 3D scattering structure (31) of FIG. 3C may be structured by stacking the plural layers (301, ..., 305) of FIG. 3A on top of one another. The fabrication process may be CMOS-compatible wherein the fabrication constraints may be directly incorporated with the design algorithm. Each layer (301, ..., 305) may be produced using lithography. The 3D scattering structure (31) may be composed of $TiO_2$ and $SiO_2$, materials that are transparent at visible frequencies. The layers (301, ..., 305) may be 2 um×2 um layers, each 400 nm tall. The person skilled in the art will understand that these are exemplary dimensions for description purposes, and that embodiments in accordance with the present disclosure, and with dimensions and numbers of layers other than those mentioned above may also be envisaged. As shown in FIG. 3B, each layer may comprise a set of irregular $TiO_2$ mesas surrounded by $SiO_2$. With reference to FIG. 3B', the lithography process may begin by growing a thin layer of dielectric (e.g., $TiO_2$) on top of a substrate (e.g., $SiO_2$). A pattern is transferred onto this layer by lithography and the unprotected material is etched away to produce a two-dimensional dielectric structure. Finally, the surface is coated (deposition) with low-refractive index dielectric and mechanically polished (planarization). By repeating the same process for each layer and stacking up layers the desired 3D structure is produced. Such a lithography process provides flexibility in material design and is compatible with industry-standard CMOS fabrication process, as noted above.

Figure 3D:
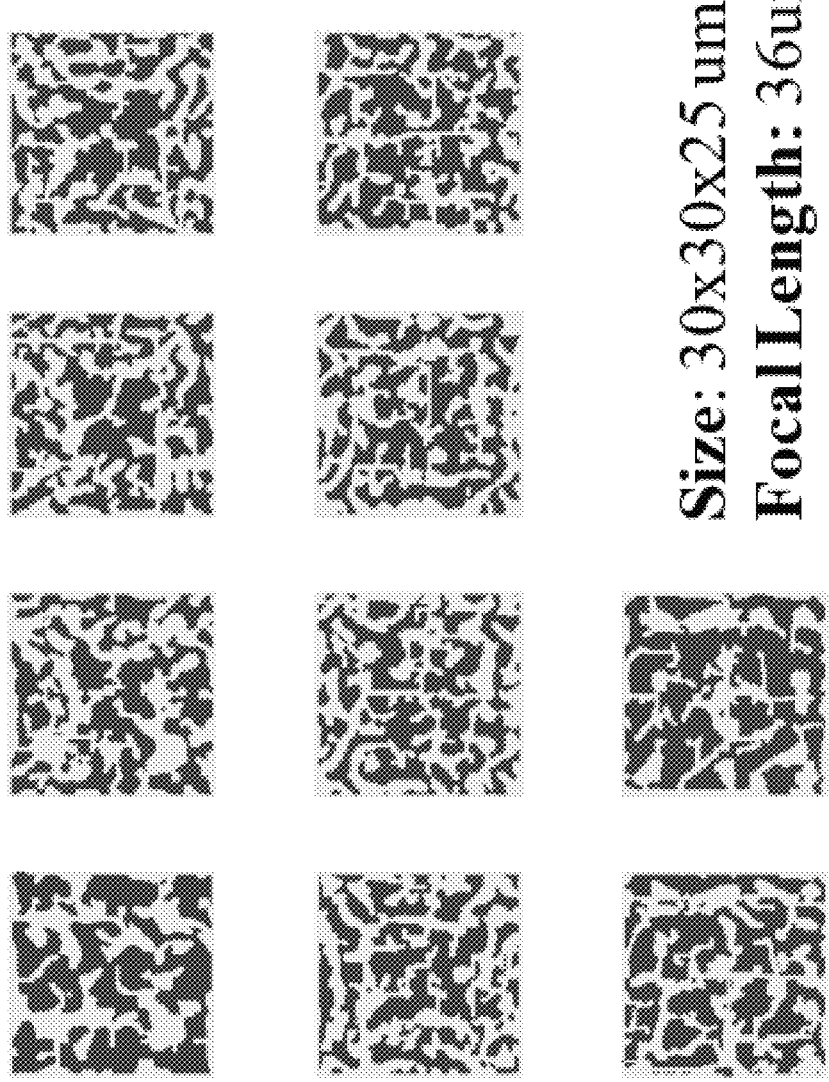
FIG. 3D shows cross sections of exemplary layers used to construct 3D scattering structure according to an embodiment of the present disclosure.
Figure 3E:
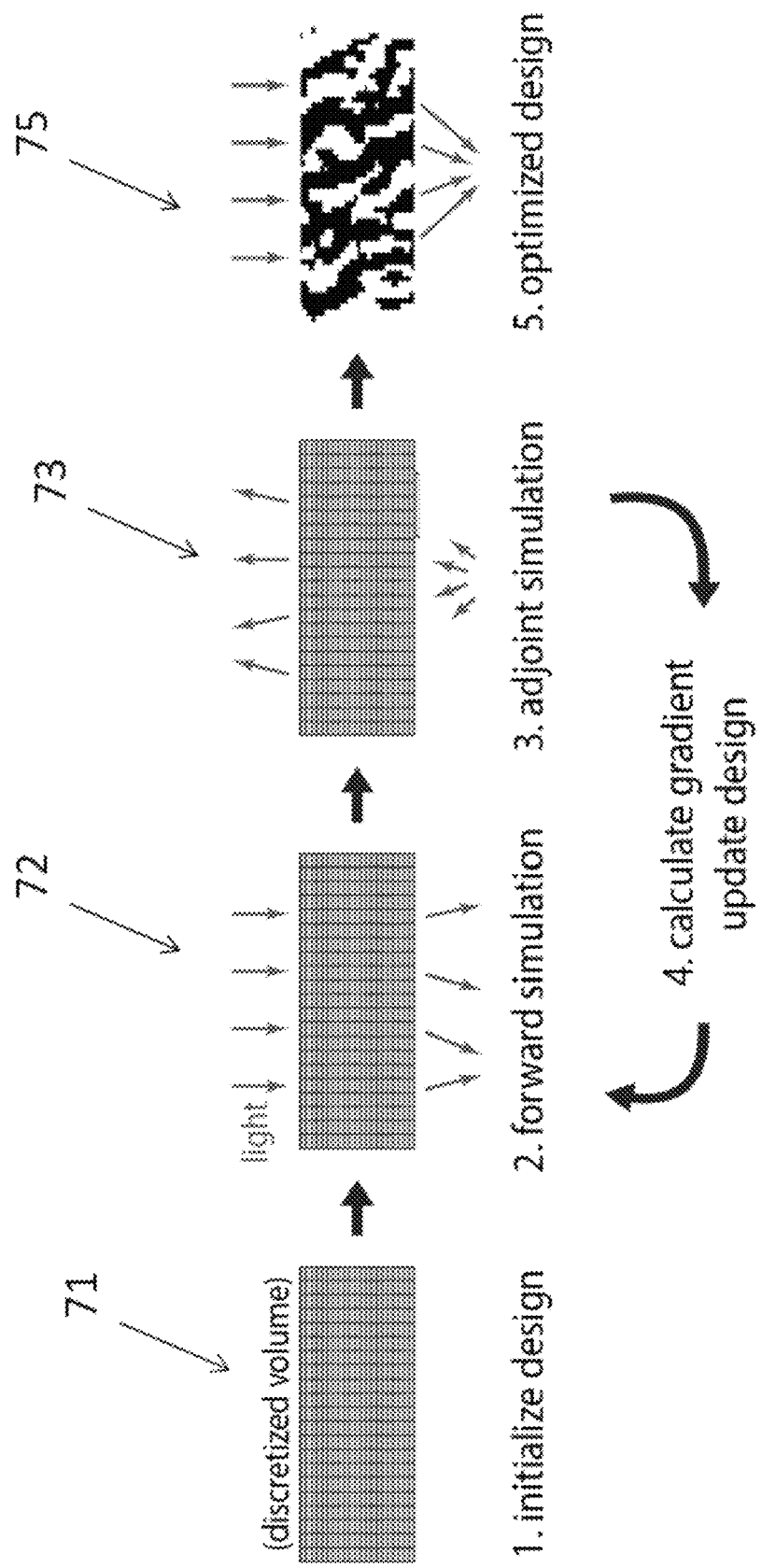
FIG. 3E shows multiple steps of an exemplary optimization algorithm in accordance with an embodiment of the present disclosure.

As a further example, the inventor has designed and fabricated a 3D scatterer for broadband polarization splitting using a stack of ten different layers, and over a bandwidth of 3.5 to 4 um. The ten layers are stacked on top of one another along a direction parallel to the direction of the incident light. The size of the fabricated device is 30×30×25 um with a focal length of 36 um. In other words, each of the ten layers has a vertical height of 2.5 um. FIG. 3D shows cross section of the ten device layers where blue is air (index of 1) and green is targeted to be IP-Dip polymer with an index of 1.5.

Referring back to FIGS. 2A-3C, and as mentioned previously, three-dimensional dielectric structures, optimized to perform a target optical scattering function are designed according to the teachings of the disclosure. In the case of the exemplary embodiments shown in FIGS. 2A-3C, such target scattering function consists of focusing incident plane waves to different positions depending on the polarization. The exemplary three-dimensional (3D) scattering structures (21, 201, 31) are defined by a spatially dependent refractive index distribution $n(\vec{x})$ within a cubic design region. This represents an expansive design space with the capacity to express a broad range of complex optical multi-functionality. However, identifying the optimal index distribution for a given target function remains a challenging inverse design problem, particularly for strongly scattering devices.

In order to overcome such a challenge, and according to the teachings of the present disclosure, an iterative approach guided by gradient descent may be implemented, wherein starting from an initial index distribution, full-wave simulations (FDTD) is used to calculate the sensitivity of the focusing efficiency with respect to perturbations of the refractive index. The sensitivity may be calculated from just two simulations, allowing efficient optimization of three-dimensional devices with modest resources. Based on the sensitivity, the initial design is modified in order to maximize the performance while conforming to fabrication constraints. This update process is repeated until the optimized device can efficiently perform the target function.

In order to further clarify what is described above, reference is made to FIG. 3E showing multiple steps of a gradient based optimization algorithm in accordance with an embodiment of the present disclosure. The algorithm is initialized, step (71), with a uniform refractive index distribution, $$n_0(\vec{x}) = \frac{n_{max} + n_{min}}{2},$$

wherein $n_{max}$ and $n_{min}$ represent the maximum and minimum values of the refractive index respectively. This distribution is continually updated to maximize the electromagnetic intensity at the target location in focal plane, $f(n(\vec{x})) = |\vec{E}(\vec{x}_0)|^2$. This objective function serves as a proxy for focusing efficiency while simplifying the sensitivity calculation. The sensitivity, $$\frac{df}{dn}(\vec{x}),$$

is computed, step 74, from the electromagnetic fields in two FDTD simulations (forward and adjoint), steps (72, 73), according to the following expression:

$$\frac{df}{dn}(\vec{x}) = 2n(\vec{x})\text{Re}\{\vec{E}_{fwd} \cdot \vec{E}_{adj}\} \quad (1)$$

where $\vec{E}_{fwd}$ are the electric fields within the cube when illuminated from above with a plane wave, step (72), and $\vec{E}_{adj}$ are the electric fields within the cube when illuminated from below, step (73) with a point source at the target location. The phase and amplitude of the point source are given by the electric field at the target location in the forward simulation. The sensitivity may be calculated for multiple polarizations across a broad bandwidth (e.g., 3.5 to 4 um), assigning each polarization to a different quadrant. The sensitivity is then used to update the refractive index of the device, step (74), using the following formula:

$$n_{i+1}(\vec{x}) = n_i(\vec{x}) + \alpha \frac{df}{dn}(\vec{x}) \qquad (2)$$

The step size α may be fixed at a small fraction (e.g., α=0.001) to ensure that the change in refractive index can be treated as a perturbation in the linear regime. The sensitivity is recalculated after each update. After several iterations, the algorithm converges to the optimized design, step (75), wherein the resulting structure focuses incident light with the desired efficiency. As mentioned previously, based on some existing work, it has been shown that polarization sensing can be achievable with metasurfaces but not demonstrated over large bandwidths. Such previous work relied upon six measurements [reference 1]. As described above, the disclosed methods and devices can use four measurements to implement broadband polarization sensing.

REFERENCES

1. Ehsan Arbabi, Seyedeh Mahsa Kamali, Amir Arbabi, & Andrei Faraon, (2018). Full-Stokes Imaging Polarimetry Using Dielectric Metasurfaces. *ACS Photonics,* 5, 8, 3132-3140.
2. Rubin, N, A., D'Aversa, G., Chevalier, P., Shi, Z., Chen, W. T., & Capasso, F. (2019). Matrix-Fourier optics enables a compact full-Stokes polarization camera. *Science.* 365(6448), eaax1839.
3. Camayd-Muñoz, P., Ballew, C., Roberts, G., & Faraon, A. (2020). Multifunctional volumetric meta-optics for color and polarization image sensors. *Optica,* 7(4), 280-283.
4. Gissibl, T., Wagner, S., Sykora, J., Schmid, M., & Giessen, H. (2017). Refractive index measurements of photo-resists for three-dimensional direct laser writing. *Optical Materials Express,* 7(7), 2293-2298.
5. Dottermusch, S., Busko, D., Langenhorst, M., Paetzold, U. W., & Richards, B. S. (2019). Exposure-dependent refractive index of nanoscribe ip-dip photoresist layers. *Optics letters,* 44(1), 29-32.
6. Hong, L., Li, H., Yang, H., & Sengupta, K. (2018). Integrated Angle-Insensitive Nanoplasmonic Filters for Ultraminiaturized Fluorescence Microarray in a 65 nm Digital CMOS Process. *ACS Photonics,* 5, 4312-4322.

What is claimed is:

1. An image sensor, comprising:
    a three dimensional (3D) scattering structure; and
    a focal plane having four sub-pixels,
    wherein:
        the 3D scattering structure comprises a plurality of dielectric pillars, and across a broad bandwidth with a fractional bandwidth of at least 0.1, the plurality of dielectric pillars is configured to split an incident electromagnetic wave along four polarization state vectors and to focus the split incident electromagnetic wave onto the four sub-pixels corresponding to the four polarization state vectors; and
    wherein the four polarization state vectors correspond to maximally spaced polarization states on a Poincare sphere.

2. The image sensor of claim 1, wherein each of the polarization state vectors comprises Stokes parameters corresponding to a circular polarization, a linear polarization, or elliptical polarizations.

3. The image sensor of claim 1, wherein the broad bandwidth includes wavelengths within a range of 3.5 to 4 um.

4. The image sensor of claim 1, wherein:
    the 3D structure comprises two or more distinct layers manufactured using CMOS fabrication processes;
    the two or more layers are stacked on top of one another in a direction parallel to a direction of incident electromagnetic wave; and
    each layer of the two or more layers is patterned using a direct write lithography process and in accordance with the four polarization state vectors.

5. The image sensor of claim 4, wherein the 3D structure comprises an IP-Dip polymer.

6. The image sensor of claim 4, wherein each layer has dimensions of 30×30×2.5 um, and the two or more layers comprises ten layers.

7. A method of splitting an electromagnetic wave, across a broad bandwidth with a fractional bandwidth of at least 0.1, into four waves with different polarization states, the method comprising:
    applying the electromagnetic wave to a three-dimensional (3D) scattering structure at a first side thereof, the 3D scattering structure being formed into a set 3D pattern in correspondence with four polarization states; and
    scattering off the electromagnetic wave to generate four electromagnetic waves with four different polarization states, the plurality of electromagnetic waves exiting the 3D scattering structure at a second side thereof; and
    wherein the four polarization states are maximally spaced on a Poincare sphere.

8. The method of claim 7, further comprising collecting each wave of the plurality of electromagnetic waves at a corresponding target area outside the 3D scattering structure.

9. The method of claim 8, wherein each target area corresponds to a sub-pixel of an image sensor.

10. The method of claim 9, further comprising, before the applying, building the 3D scattering structure by stacking up layers patterned in correspondence with the four polarization states and manufactured using a direct write or standard sequential lithography process.

11. A camera built based on the method of claim 9.

12. The method of claim 7, further comprising optimizing the 3D pattern with a gradient-based algorithm.

13. The method of claim 12, wherein the gradient-based algorithm is used to optimize electromagnetic intensities along four polarization state vectors in correspondence with the four polarization states.

* * * * *